United States Patent [19]

Tsenter

[11] Patent Number: 5,729,116
[45] Date of Patent: Mar. 17, 1998

[54] SHUNT RECOGNITION IN LITHIUM BATTERIES

[75] Inventor: Boris Tsenter, Rosswell, Ga.

[73] Assignee: Total Battery Management, Inc., Georgia, Pa.

[21] Appl. No.: 771,030

[22] Filed: Dec. 20, 1996

[51] Int. Cl.$^6$ .............................. H01M 10/44; H02J 7/04
[52] U.S. Cl. ................... 320/30; 320/39; 320/31; 320/21
[58] Field of Search ............................ 320/21, 19, 31, 320/39, 30

[56] References Cited

U.S. PATENT DOCUMENTS

| | | |
|---|---|---|
| 3,487,284 | 12/1969 | Cady . |
| 3,639,173 | 2/1972 | Stachurski ............................ 320/30 |
| 3,890,556 | 6/1975 | Melling et al. . |
| 3,911,349 | 10/1975 | Seeley et al. . |
| 3,911,350 | 10/1975 | Swope . |
| 3,953,302 | 4/1976 | Rao et al. . |
| 4,016,473 | 4/1977 | Newman . |
| 4,079,303 | 3/1978 | Cox . |
| 4,086,525 | 4/1978 | Ibsen et al. . |
| 4,139,680 | 2/1979 | Schlaikjer . |
| 4,345,008 | 8/1982 | Breault . |
| 4,385,269 | 5/1983 | Aspinwall et al. . |
| 4,388,582 | 6/1983 | Saar et al. . |
| 4,392,101 | 7/1983 | Saar et al. . |
| 4,414,291 | 11/1983 | Breault . |
| 4,554,500 | 11/1985 | Sokira . |
| 4,560,937 | 12/1985 | Finger . |
| 4,680,528 | 7/1987 | Mikami et al. . |
| 4,725,784 | 2/1988 | Peled et al. . |
| 4,736,150 | 4/1988 | Wagner ............................ 320/21 |
| 4,746,854 | 5/1988 | Baker et al. . |
| 4,761,487 | 8/1988 | Godshall . |
| 4,806,840 | 2/1989 | Alexander et al. . |
| 5,017,856 | 5/1991 | Johnson, Jr. . |
| 5,049,803 | 9/1991 | Palanisamy ............................ 320/39 X |
| 5,057,762 | 10/1991 | Goedken et al. . |
| 5,119,009 | 6/1992 | McCaleb et al. . |
| 5,132,626 | 7/1992 | Limuti et al. . |
| 5,143,799 | 9/1992 | Tsenter . |
| 5,157,320 | 10/1992 | Kuriloff . |
| 5,166,596 | 11/1992 | Goedken . |
| 5,179,335 | 1/1993 | Nor . |
| 5,200,689 | 4/1993 | Interiano et al. . |
| 5,204,611 | 4/1993 | Nor et al. ............................ 320/21 |
| 5,206,578 | 4/1993 | Nor . |
| 5,237,257 | 8/1993 | Johnson et al. . |
| 5,278,000 | 1/1994 | Huang et al. . |
| 5,290,640 | 3/1994 | Tsenter et al. . |
| 5,291,117 | 3/1994 | Rydborn . |
| 5,296,797 | 3/1994 | Bartlett ............................ 320/21 |
| 5,296,997 | 3/1994 | Betton et al. . |
| 5,304,915 | 4/1994 | Sanpei et al. . |

(List continued on next page.)

OTHER PUBLICATIONS

Damon W. Chu, "Tradeoffs in Implementing Intelligent Battery Management", Jul. 10, 1995, 6 pgs.

David Freeman, "Freeing Portables from Battery Tyranny," Jul. 10, 1995, 6 pgs.

Primary Examiner—Peter S. Wong
Assistant Examiner—K. Shin
Attorney, Agent, or Firm—Reed Smith Shaw & McClay

[57] ABSTRACT

An apparatus and method of recognizing a shunt caused by formation of dendrites in a rechargeable lithium battery which comprises charging the battery with a charging current, sampling the charging current voltage of the battery at pre-determined time intervals in order to identify one or more point indicating onset of shunting, and terminating charging if the shunt or dendrite is indicated. If a shunt is not recognized charging is continued. Dendrite formation or the beginning of shunting due to such formation is indicated by any one of the following conditions: a negative gradient in sampled voltage values; a negative gradient in sampled steady open circuit values; and a negative gradient in the chemical polarization voltage values which may be calculated by sampling both the open circuit voltage soon after current interruption and steady open circuit voltages during a plurality of currentless phases.

16 Claims, 5 Drawing Sheets

U.S. PATENT DOCUMENTS

| | | |
|---|---|---|
| 5,304,917 | 4/1994 | Somerville . |
| 5,307,000 | 4/1994 | Podrazhansky et al. . |
| 5,321,347 | 6/1994 | Chien . |
| 5,329,219 | 7/1994 | Garrett . |
| 5,330,861 | 7/1994 | Fetcenko et al. . |
| 5,331,268 | 7/1994 | Patino et al. . |
| 5,343,380 | 8/1994 | Champlin . |
| 5,349,281 | 9/1994 | Bugaj . |
| 5,350,995 | 9/1994 | Iketani . |
| 5,350,996 | 9/1994 | Tauchi . |
| 5,352,967 | 10/1994 | Nutz et al. . |
| 5,365,160 | 11/1994 | Leppo et al. . |
| 5,369,364 | 11/1994 | Renirie et al. . |
| 5,376,873 | 12/1994 | Toya . |
| 5,391,193 | 2/1995 | Thompson . |
| 5,396,163 | 3/1995 | Nor et al. . |
| 5,408,170 | 4/1995 | Umetsu et al. . |
| 5,411,537 | 5/1995 | Munshi et al. . |
| 5,412,306 | 5/1995 | Meadows et al. . |
| 5,418,084 | 5/1995 | Georgopoulos . |
| 5,422,559 | 6/1995 | Hall et al. . |
| 5,432,029 | 7/1995 | Mitate et al. . |
| 5,432,426 | 7/1995 | Yoshida . |
| 5,432,429 | 7/1995 | Armstrong, II et al. . |
| 5,440,221 | 8/1995 | Landau et al. . |
| 5,442,274 | 8/1995 | Tamai . |
| 5,444,353 | 8/1995 | Shinohara . |
| 5,449,996 | 9/1995 | Matsumoto et al. . |
| 5,449,997 | 9/1995 | Gilmore et al. . |
| 5,460,899 | 10/1995 | Charkey . |
| 5,467,005 | 11/1995 | Matsumoto et al. . |
| 5,475,294 | 12/1995 | Isoda ......................... 320/39 X |
| 5,477,125 | 12/1995 | Ettel et al. ..................... 320/39 X |
| 5,481,174 | 1/1996 | Martin et al. ................... 320/21 X |
| 5,483,165 | 1/1996 | Cameron et al. . |
| 5,489,836 | 2/1996 | Yuen . |
| 5,498,492 | 3/1996 | Hara et al. . |
| 5,500,583 | 3/1996 | Buckley et al. . |
| 5,576,608 | 11/1996 | Nagai et al. ..................... 320/31 X |
| 5,589,755 | 12/1996 | Kaite et al. ..................... 320/21 |
| 5,600,226 | 2/1997 | Falcon ............................ 320/39 X |
| 5,604,418 | 2/1997 | Andrieu et al. ................... 320/21 |
| 5,614,805 | 3/1997 | Momotani et al. ................ 320/21 |

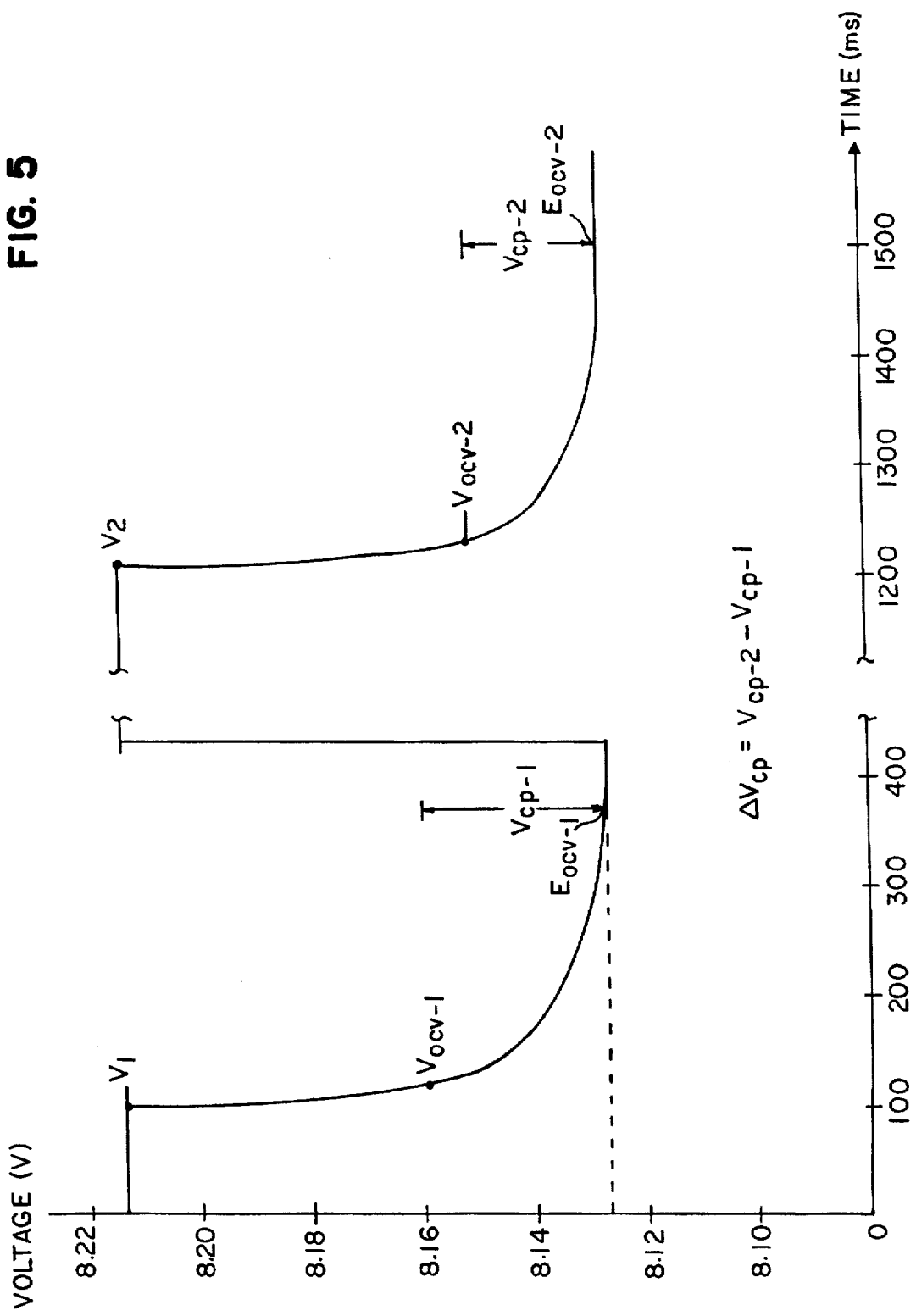

SHUNT RECOGNITION IN LITHIUM BATTERIES

BACKGROUND OF THE INVENTION

1. Field of the Invention

The present invention relates generally to enhanced performance of secondary batteries, more particularly, to enhanced performance of secondary lithium batteries resulting from recognition of shunts which may occur during the charging of the rechargeable lithium batteries.

2. Description of the Related Art

Although the terms battery and cell are used interchangeably herein, a battery consists of one or more cells connected in series, or parallel, or both depending on the desired output voltage and capacity of the battery. The cell is the basic electrochemical unit and consists of an anode, cathode, and electrolyte. When a full state of charge is discussed herein, it is to be understood that the battery or cell being charged has reached nearly 100% of the capacity of stored energy, measured in ampere-hours.

As miniaturization and power saving have proceeded in the field of electronics, secondary batteries using alkaline metals such as lithium have attracted attention. Rechargeable lithium batteries operating at room temperature offer several advantages compared to conventional aqueous technologies, including: higher energy density (up to 150 Wh/kg, 300 Wh/L); higher cell voltage (up to about 4 V per cell); and longer charge retention or shelf life (up to 5 to 10 years). These advantageous characteristics result in part from the high standard potential and low electrochemical equivalent weight of lithium. However, ambient temperature lithium rechargeable batteries do not have a high rate capability because of the relatively poor conductivity of the aprotic organic or inorganic electrolytes that must be used. In addition, rechargeable lithium cells that use lithium metal as the negative electrode presents potential safety problems which are more challenging than those with primary lithium batteries. This is primarily due to the fact that a 3-5 fold excess of lithium is required for these types of cells in order to obtain a reasonable cycle life. Another safety concern is the reactivity of the porous high surface area lithium that forms during cycling with the electrolyte.

There are essentially five different classifications of rechargeable lithium batteries. The first category is a solid-cathode cell using intercalation compounds for the positive electrode, a liquid organic electrolyte, and a metallic lithium negative electrode. The second type is a solid-cathode cell using intercalation compounds for the positive electrode, a polymer electrolyte, and a metallic lithium negative electrode. The third type use intercalation compounds for both the positive and the negative electrode and a liquid or polymer electrolyte (lithium ion cells). The fourth type are inorganic electrolyte cells which use the electrolyte solvent or solid redox couple for the positive and lithium metal for the negative active material (lithium ion type cells have also been investigated with inorganic electrolytes). Finally, the fifth type are cells with lithium alloy anodes, liquid organic or polymer electrolytes and a variety of cathode materials, including polymers.

It is believed that the reduced cycle life in secondary lithium electrolytic cells arises in part from lithium dendrite growth on the cathodic surface during recharging of the discharged battery. Specifically, it is believed that during each recharging cycle lithium dendrites form on the surface of the cathode and expand or grow outward. The dendrite growth outward pushes aside the pliable electrolyte and/or penetrates the separator of a liquid electrolyte cell. Dendrite growth is cumulative over repeated recharging cycles, and there is eventually contact with the anode that results in micro shorts or shunts which in turn eventually short the entire battery and terminate the useful life of the battery. Prior to total battery failure, premature shorting of the battery often results in overcharge or overdischarge of the individual cells. This is a particular adverse consequence when using lithium based batteries since they are very sensitive to overcharge and overdischarge. It is highly desirable to provide a mechanism to prevent both the overcharge and overdischarge of such cells due to dendrite formation and increase the efficient utilization and available life cycle of the lithium based cells.

When rechargeable lithium based batteries were first introduced they were designed as small cylindrical cells incorporating a lithium anode and an intercalation cathode as the positive electrode with a liquid organic electrolyte. These lithium metal batteries were soon withdrawn from the market as a result of safety concerns. As mentioned above, the safety concerns were due at least in part to the fact that dendrite formation often resulted in a shunt or micro-shorts. The shunt results in a relatively high surface area lithium which may react with the electrolyte. This reaction is very exothermic and may result in the temperature of the battery reaching the melting point of metallic lithium (180° C.). The exothermic reaction is very difficult to control and can be very dangerous because without the availability of sufficient venting, the lithium batteries can often violently explode.

In recent years a new generation of rechargeable batteries have been introduced in response to the safety problems presented by the original lithium metal batteries. These newer generation batteries employ an intercalated carbon material as the negative electrode instead of metallic lithium. Intercalation of lithium ion occurs during the discharging process and de-intercalation of lithium ion occurs during the charging process. The use of a carbon matrix is designed to avoid the problems associated with the earlier metallic lithium batteries by preventing dendrite formation or expansion from the metallic lithium electrode by reducing the availability of a high surface area between the negative electrode and the electrolyte. However, it appears that in many instances the use of the carbon matrix only initially avoids the problem of shunting. This may be due to electroplating of lithium metal on the external surface of the carbon matrix. As a result, these newer generation batteries face many of the same problems as encountered by the earlier generation lithium batteries.

It is expected that the market share enjoyed by lithium rechargeable batteries will increase significantly during the next decade because of their high-energy density and their ability to meet consumer demands for lighter weight and longer service more adequately than the conventional aqueous rechargeable batteries. Larger rechargeable lithium based cells are also being considered for a number of military and commercial applications including underwater propulsion and electric vehicles. The continued development of these cells with the elimination of safety concerns, improvement of capacity in cycle life, effective economical upscaling of size, and a reduction of cost should encourage commercialization and expansion of the rechargeable lithium batteries into new markets.

U.S. Pat. No. 3,953,302 describe additives which may be added to prevent dendritic deposition of lithium. The additives are complex salts such as $K_3(Fe(CN)_6)$ or $Co(NH_3)_5Cl)Cl_2$. This approach suffers from the fact that the effect of the additive depends on many factors, including electrolyte concentration, local current density, and temperature. Accordingly it is difficult to have stable and repeatable prevention of dendrite formation.

U.S. Pat. No. 5,481,174 assigned to Motorola attempts to address the issue of formation or the appearance of shunts by regulating the average current, the current being dependent on a control time of reaching a preselected maximum voltage. Although this approach does help alleviate the decomposition of the electrolyte it has very little to do with protecting the battery from shunting.

U.S. Pat. No. 5,442,274 teaches the use of hysteresis or repetitive peak and trough charging prior to constant voltage charging. During peak charging, the battery is charged by a constant current or quasi-constant current, and during the trough of the charging wave, the battery charging process is either suspended or the charging current is reduced from the level at peak charging. This is a simplified charging process which does not adequately address the safety concerns associated with lithium batteries.

U.S. Pat. No. 5,119,009 claims that it is necessary to switch the battery to discharge to fully dissipate all of the metallic lithium remaining in the battery before disposing of it. Although this reference alleviates the problem associated with lithium battery disposal by means of transferring the metallic lithium in lithium ion form, it does not address charging safety issues.

U.S. Pat. No. 4,736,150 discusses the benefits of pulse charging to prolong the cycle life for a lithium molybdenum disulfide ($Li/MoS_2$) batteries. Again this method does not address the safety problems or issues confronted when using lithium based rechargeable batteries.

SUMMARY OF THE PRESENT INVENTION

The present invention is directed to a battery charger for rechargeable lithium secondary cells which is capable of recognizing both a hard and a soft shunt as well as the occurrence of chemical shunting. The battery charger itself comprises a power supply to provide charging current to the battery, a charge interrupter for periodically interrupting the charging current, a voltage sensor for sampling a voltage of the battery, a data compiler for compiling and analyzing the voltage values to identify a voltage point indicating onset of a shunting, a charging current adjuster for adjusting the charging current when said voltage points are identified. The voltage sampler samples the charging voltage V at a plurality of points and preferably feeds this information to the microprocessor or data compiler which calculates or derives a voltage gradient $\Delta V$. The charging current is terminated by the charging current adjuster if the derived voltage gradient $\Delta V$ is greater than a predetermined voltage gradient $\Delta V°$ ($\Delta V > \Delta V°$). Similarly the voltage sampler samples the steady open circuit voltage $E_{OCV}$ during a plurality currentless periods to derive a steady open circuit voltage gradient $\Delta E_{OCV}$. If the steady open circuit voltage gradient $\Delta E_{OCV}$ is greater than a predetermined steady open circuit voltage gradient $\Delta E_{OCV}°$ ($\Delta E_{OCV} > \Delta E_{OCV}°$) the charging current is terminated because a soft shunt is indicated. Additionally, the voltage sampler samples chemical polarization values during a plurality of currentless phases to derive a chemical polarization gradient $\Delta V_{CP}$. If the chemical polarization gradient $\Delta V_{CP}$ is greater than a predetermined chemical polarization voltage gradient $\Delta V_{CP}°$ ($\Delta V_{CP} > \Delta V_{CP}°$) then charging is terminated as a result of a chemical shunt being recognized.

The method of shunt recognition of the present invention provides a means to charge a battery with a charging current and to sample and analyze the voltage of the battery at pre-determined time intervals to identify one or more point indicating onset of shunting. If onset of shunting is identified, charging is terminated. Otherwise charging is continued until the point indicating the onset of shunting is recognized, indicated, or, identified. The point which indicates onset of dendrite formation or shunting is selected from the group consisting of: a negative gradient in sampled voltage values, $-\Delta V$; a negative gradient in sampled steady open circuit values $-\Delta E_{OCV}$, a negative gradient in chemical polarization voltage values $-\Delta V_{CP}$, and a function of any two or all three of the above points. To obtain $\Delta V$, the voltage sampled during charging is sampled at a plurality of time intervals preferably within 1 ms–5 seconds of each other. To obtain steady open circuit gradient $\Delta E_{OCV}$ and chemical polarization voltage gradient $\Delta V_{CP}$, the open circuit voltage of the battery is sampled during a plurality of currentless phases. Depending on when the open circuit voltage is sampled or measured, the open circuit voltage information will provide specific information regarding the potential shunting and type of shunting occurring in the battery. If the open circuit voltage is sampled 5 ms after the charging current is interrupted and preferably before 5 seconds (5,000 ms) after the charging current is interrupted, a drop or negative gradient which exceeds a predetermined steady open circuit voltage drop or gradient indicates the onset of soft shunting. Combining the steady open circuit voltage $E_{OCV}$ with an open circuit voltage value obtained during the same currentless phase period as $E_{OCV}$ and sampled within the range of 1–5 ms after the charging current has been interrupted permits the chemical polarization voltage, $V_{CP}$, to be calculated or determined. If a drop or negative gradient in the chemical polarization value exceeds a predetermined value for chemical polarization voltage then this indicates the onset of chemical shunting.

The present invention also provides a method of dendrite recognition in a rechargeable lithium battery which comprises: sampling a charging voltage of the battery; interrupting charging of the battery to sample an open circuit voltage of the battery; identifying one or more points indicative of dendrite formation; continuing charging if the point indicative of dendrite formation is not identified; and terminating charging if the point indicative of dendrite formation is identified. As above, the point indicative of dendrite formation or the beginning thereof is chosen from among: a negative gradient in sampled voltage values, $-\Delta V$; a negative gradient in sampled steady open circuit values $-\Delta E_{OCV}$; and a negative gradient in chemical polarization voltage values $-\Delta V_{CP}$.

BRIEF DESCRIPTION OF THE DRAWINGS

The features, aspects, and advantages of the present invention will become better understood with regard to the following description, appended claims, and accompanying drawings where:

FIG. 5 is a graph illustrating a typical charging and data sampling scheme according to the present invention.

DETAILED DESCRIPTION OF THE PREFERRED EMBODIMENTS

Figure 1:
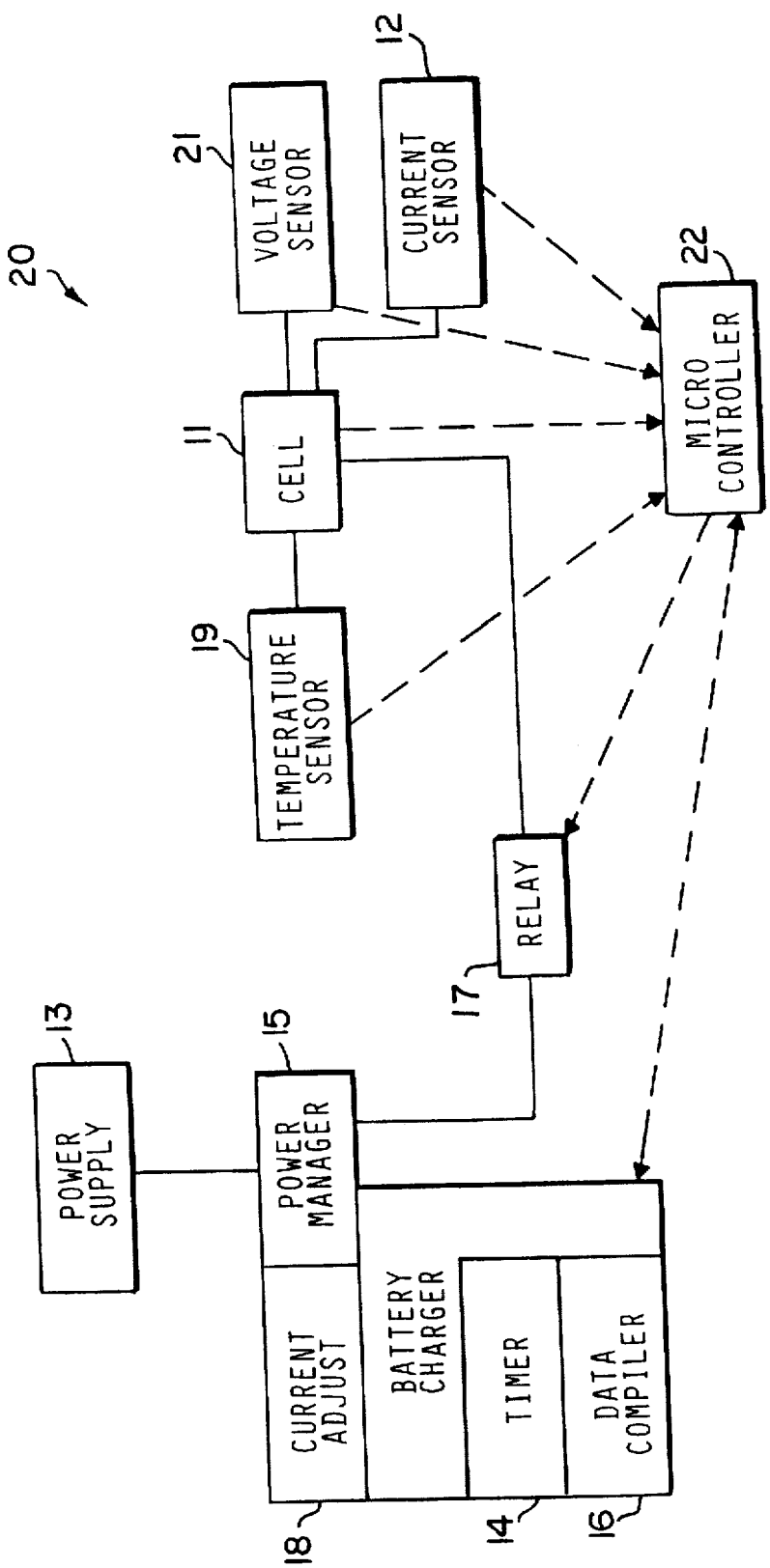
FIG. 1 illustrates a schematic circuit diagram for the preferred embodiment of a battery charger according to the present invention.

In view of the related art, there exists a need for a battery charger which recognizes lithium dendrite growth during recharging or discharging of an electrolytic cell in order to use this information to avoid such growth and prolong the cycle life of the cells, and hence the cycle life of the battery. Additionally, a method and apparatus which recognizes the beginning of shorts due to dendrite or other chemical phenomenon would be very useful in extending the applicability of rechargeable lithium batteries. Recognizing this type of shunt formation would also be useful in preventing the deleterious consequences of shorts or shunts in the battery. Such a battery charger would increase the cycle life of the battery, increase the efficiency with which lithium based secondary batteries are charged, and minimize the safety concerns of rechargeable lithium based batteries.

The battery charger and method of recharging lithium based batteries disclosed herein focuses on the rechargeable lithium ion cells. However, the principles of the present invention can be extended to include the other types of rechargeable lithium based batteries. The rechargeable lithium ion batteries use an intercalation compound as both the positive and negative electrodes and a liquid or polymer electrolyte, preferably a liquid organic electrolyte. In these types of cells, the carbon materials are designed to reversibly accept and donate significant amounts of lithium (Li:C is equal to about 1:6) without effecting the mechanical and electrical properties of the cell. The intercalation material is used for the anode instead of metallic lithium. Carbon material can be used as an anode in lithium ion cells due to the fact that the chemical potential of the lithiated carbon material is almost identical to that of metallic lithium. Thus, an electrochemical cell made with lithiated carbon material will have almost the same open circuit voltage as one made with metallic lithium. In practice, the lithium ion cell is manufactured in a fully discharged state. Instead of using lithiated carbon material which is air sensitive, the anode is made with carbon and lithiation is carried out by charging the cell for a first time. The specific energy or capacity of the lithium ion system depends largely on the type of carbon materials used. The lithium intercalation efficiency, and the irreversible capacity associated with the first charge process. It has been found that coke-type carbon, having physical properties such as ash content <0.1%, surface area <10 m$^2$/g, true density <2.15 gram/cm$^2$, and an innerlayer spacing greater than 3.45 Å is preferable for lithium ion system. These types of carbon materials can provide about 185 mAh/g capacity (corresponding to LiC$_{12}$). Doping with nitrogen, boron or phosphorous can increase capacity of the coke-type materials to 370 mAh/g. Graphitic carbons having an innerlayer spacing of 3.36 Å can deliver 370 mAh/g capacity in some select electrolytes.

It should be noted that in the detailed description which follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

In accordance with the present invention, FIG. 1 illustrates a schematic circuit diagram for the preferred embodiment of the present invention. Battery charger 20 is comprised of the necessary elements for achieving the methodology of shunt recognition described herein. A rechargeable lithium battery or cell 11 is connected to a power supply 13 through power manager 15. Power manager 15, for example a 12 Volt 1 Amp AC adapter, provides charging current at a predetermined amplitude through current adjuster 18 to the battery 11. Voltage sensor 21 may include a scaler and a sensor to sample the voltage and open circuit voltage $V_{OCV}$ of the battery 11 and feed this information to microcontroller 22. The microcontroller 22 used in the present invention is a MC608HC705 B5 type and includes 6 KB memory ROM, 128 byte RAM, 4–8 bits parallel ports, 8 A/D inputs and 2 pulse width modulators (PWM). Of course, other micro-controllers could be used interchangeably. The shunt resistor or current sensor 12 may include a differential amplifier to accurately monitor the current applied to the battery or cell 11. Temperature detector or sensor 19 is utilized to measure the temperature T of the battery 11. Although not critical to the present invention, the temperature detector 19 may be useful as a default mechanism to prevent explosive reactions from taking place. The collected information is fed to a microcontroller 22 which can in turn signal adjustment or termination of the charging current by power manager 15 through current adjuster 18. Preferably, after an equilibrium period which may be preset into microcontroller 22 or a timer 14, the current is interrupted by a relay 17 so that the open circuit voltage $V_{OCV}$ of the battery 11 can be sampled. The microcontroller 22 is used to run and monitor the operation of the circuit and to compile and analyze the charging voltage values and open circuit voltage $V_{OCV}$ values to identify the end of charging or the onset of shunting. The microprocessor 22 will signal termination of the charging current if the onset of shunting is identified or if charging is complete. A data compiler 16 which may or may not be integrated into microcontroller 22 may function to compile the charging and open circuit voltage information to thereby minimize the microprocessor time dedicated to this task. Voltage sensor 21 is precise enough to measure the open circuit voltage within 1 millisecond of charge interruption to thereby obtain information regarding both the ohmic and chemical polarization components of the cell or battery 11. The limitation of 1 ms being adequate for measuring the necessary open circuit voltage data points in the present invention. However, it would be preferable that the sensor 21 were capable of being even more sensitive so that the open circuit voltage could be sampled prior to 1 ms. It should be noted that the microcontroller 22, sensor 12, relay 17, voltage sensor 21, temperature sensor 19, power manager 15, timer 14, current adjuster 18, and data compiler 16 may be collectively referred to as the battery charger, and that all or part of these elements may be integrated into the microcontroller 22.

As briefly discussed above, the use a lithiated carbon intercalation material as the negative electrode instead of metallic lithium does significantly reduce the safety concerns associated with rechargeable lithium batteries by stabilizing the working surface of the negative electrode. However, this does not appear to adequately satisfy the safety requirements in a rechargeable lithium battery. Intercalation of the lithium ion decreases the state of charge of the oxidizer in the process of charging and, similarly, during de-intercalation of the lithium ion there is an increase in the valence of metal oxide. The carbon based intercalation material, i.e., graphite or coke, can reversibly accept lithium ions during charge or donate them during discharge, transferring them from or to the positive electrode. The partial and overall reactions for charging and discharging in these systems can be written as follows:
on the negative electrode (Li/C electrode);

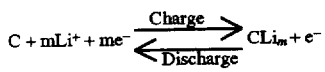 (1)

on the positive electrode;

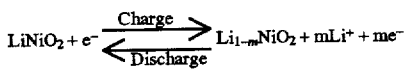 (2)

overall;

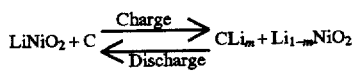 (3)

The partial and overall reactions are illustrated for the lithiated transition metal, nickel oxide. However, the same reactions hold for the other commonly used lithiated transition metal oxides, lithiated cobalt oxide and lithiated manganese oxide ($LiMn_2O_4$). The reversible value of m for $LiCoO_2$ and $LiNO_2$ is preferably less than or equal to 0.5, and the value m is preferably greater than or equal to 0.85 for lithiated manganese oxide. In the long run, it is expected that the manganese-based compounds will become the material of choice as they are more abundant, less expensive, and nontoxic. It is noted, however, that lithium-ion cells made with $LiMn_2O_4$ require a higher charge voltage than the other transition metal oxides.

One cause of dendrite formation arises when the charging rate, $I_{ch}$, exceeds the diffusion rate, $I_d$ of the lithium ion, $Li^+$. In order to prevent dendrite formation during charging the charging rate should be maintained at a rate less than the rate of diffusion ($I_{ch} < I_d$). This is often difficult due to a number of factors including an uneven current distribution (increased $I_{ch}$) or decreased rate of diffusion ($I_d$).

Although the solid structure of the carbon matrix is designed to prevent the lithium electrode from sporadically increasing its size or surface area during the battery charging and discharging process, the reversible potential for the lithium metal incorporated within the carbon matrix is in the range of 10 to 40 mV more negative than the reversible potential of the lithium metal. Therefore, as a rule, lithium should electroplate inside the carbon matrix. However, during the normal cycle life of the battery 11 or during over voltage conditions, the electroplating lithium can precipitate on the external surface of the carbon matrix. Accordingly, there are two major problems associated with the lithiated carbon matrix in rechargeable lithium batteries. The first is an increased surface area of electroplated lithium metal which results in a higher probability of contact between the electrolyte and the lithium metal, and the second is a resulting increase in dendrite formation.

This invention is particularly directed to shunt recognition during the charging process and more specifically to recognition and differentiation of hard, soft, and chemical shunting. As used herein, a hard shunt is a shunt which affects the safety of the battery 11, and a soft shunt is a shunt which effects the operation of the battery 11, and which if goes unrecognized will eventually result in a hard shunt. A third type of shunt can be designated as a chemical shunt. This shunt is non-electrical in nature and can be specified as the chemical reaction between lithium metal and the electrolyte.

Figure 2:
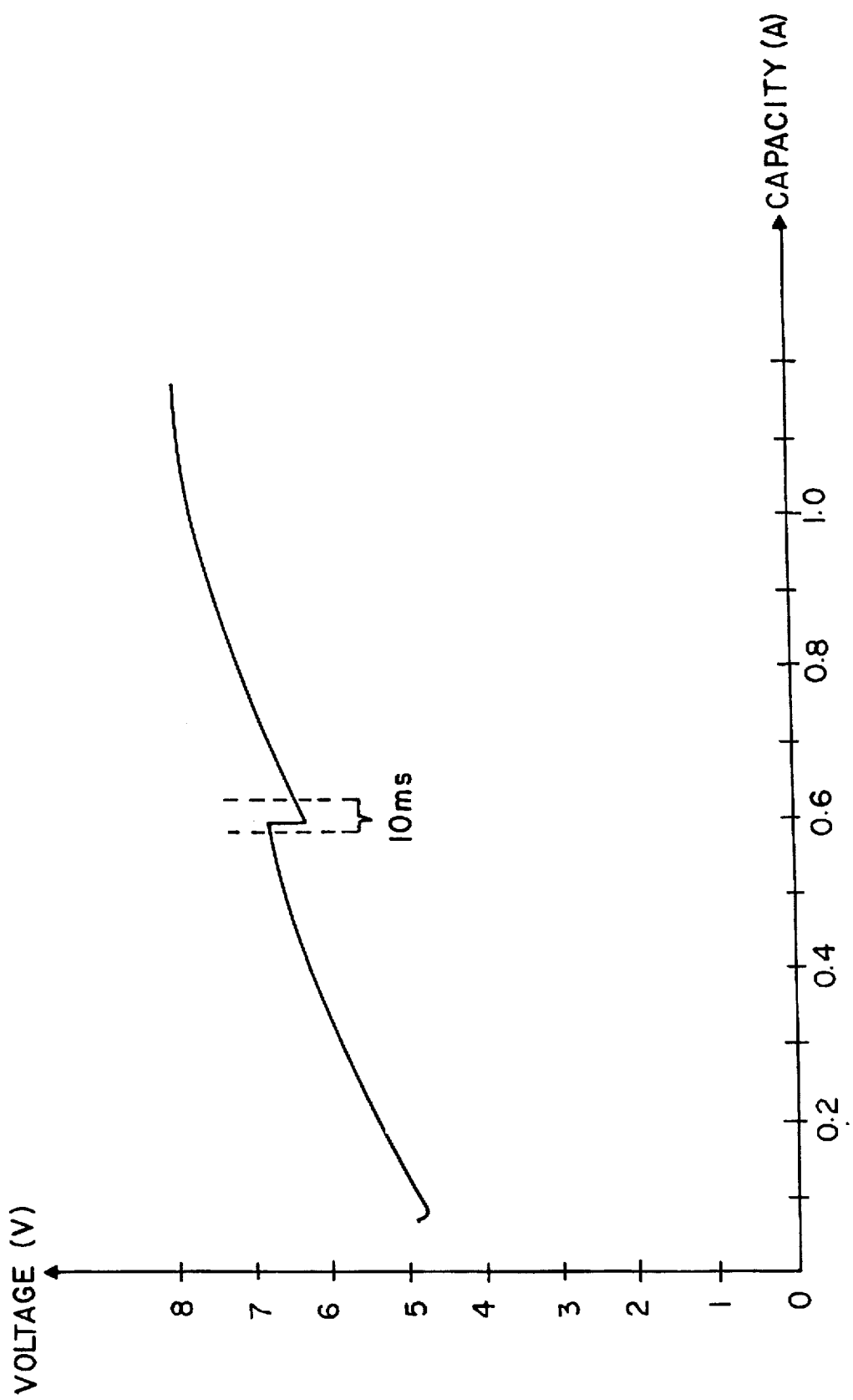
FIG. 2 is a graph illustrating the voltage of a battery versus charging time wherein the hard shunt is recognized.

Referring to FIG. 2, the first aspect of shunt recognition is to monitor for a drop in the voltage during the charging process in order to recognize a hard shunt. A hard shunt can be recognized by an immediate voltage drop during a transient time after a load has been applied to an electrochemical cell. The information provided by this initial voltage drop $\Delta V$ can be utilized to recognize the process of dendrite formation in the electrochemical cell. As soon as the battery 11 begins to shunt, the voltage immediately drops and the difference between a first voltage value $V_1$ and a second or later sampled voltage value $V_2$ measured within a short time interval, $\tau$, of $V_1$ can be used for shunt recognition. However, as seen by the time insert in FIG. 2, the time interval between sampling $V_1$ and $V_2$ must be small enough, i.e. 10 milliseconds, that a drop in the voltage will be observed. This is due to the fact that the tendency of the charging cycle is for the other electrochemical cells to adjust or compensate for the voltage drop associated with a shunt in one cell. Although the shunt may be isolated to one cell, the rise in the charging curve is a result of a compensatory effect from the other battery cells. Once the battery 11 has compensated for the initial drop, it will not appear that the beginning of the shunting process has occurred. Accordingly, it is possible to recognize the hard shunt only if a sufficiently small time interval between voltage measurements is utilized. The time interval for sampling the voltage of the battery during charging should be within the range of 1–5,000 milliseconds, preferably 5–1,000 milliseconds, more preferably, 10–500 milliseconds and most preferably approximately 10 milliseconds.

The occurrence of a hard shunt can be accurately predicted by utilizing the operational temperature and the thermal capacity of the battery. The following example utilizes a NP-500 lithium cell as an example having a manufacturer suggested maximum operational temperature of approximately 40° C., wherein the ultimate temperature of the battery should not exceed a temperature of 30°–40° C. in order to operate safely and exclude the possibility of combustion, and wherein the thermal capacity ($C_p$) of the NP-500 type is equal to 40–50 J/g·grad. To approximate the point at which a shunt will occur (maximum shunt value) an equation for thermal balance (Eq. 4), is utilized taking into consideration that a hard shunt results in overheating:

$$(V^2/R) \cdot t = C_p \Delta T \quad (4)$$

Here R is the resistance of the hard shunt; $(V^2/R) \cdot t$ is heat generated by the shunt, and $C_p \cdot \Delta T$ is the heat consumed by the cell.

From Eq. 4 we can obtain:

$$R = V^2 \cdot t/(C_p \cdot \Delta T) \quad (5)$$

Calculating R for the lithium cell with a voltage of 3.5V and a time equal to 10 minutes gives:

$$R = (3.5V)^2 \cdot 600s/(40J \cdot g^{-1} \cdot \mathrm{grad}^{-1} \cdot 40°\,C.) = 4.6\Omega \quad (6)$$

This hard shunt resistance can cause a leakage current of a magnitude:

$$I_1 = V/R = 3.5V/4.6\Omega = 0.75 \quad (7)$$

This current can cause a voltage drop equal to $$\Delta V = I_1 R_C = (0.75A) \cdot (0.15\Omega) = 1.115V \quad (8)$$

Wherein $R_C$ is the internal cell resistance being equal to 0.15 Ω for a NP-500 lithium cell. Accordingly, if the resistance value for the hard shut is greater than 4–6 Ω (Eq. 6) combustion of the battery 11 could result. The hard shunt can be recognized by a voltage drop ΔV of from about 0.08V to about 0.11V (Eq. 8) during a transient time after the load has been applied. From above, if over the transient time after the load has been applied, i.e. a transient time of 1 ms between measurements, the battery 11 experiences a voltage drop of 0.08V to about 0.11V (80–110 mV) in a 1 ms period, this indicates that the cell has entered a stage of hard shunt, and therefore, charging should be terminated.

As stated earlier, a soft shunt can be specified as a shunt which has effect on the operation of the battery and can also be associated with the battery's cycle life. Leakage current is usually associated with the process of soft shunting. Leakage current and soft shunting will result in different cells of the battery existing in different states of charge. It is this difference between the individual cells state of charge which can causes overcharge or overdischarge of individual cells. As a result of the cells being overcharged or overdischarged, the cycle life of the battery is greatly reduced. A main component involved in reducing cell cycle life is the irreversible decomposition and loss of electrolyte in the battery. Unlike nickel based batteries, there is no chemical mechanism for overcharge protection in lithium based batteries. Over a prolonged period of time a soft shunt can be converted to a hard shunt. Metallic lithium can electroplate on the shunt and decrease the shunt resistance. As soon as the soft shunt converts to the hard shunt, the minor operational problems are converted into serious safety problems. Accordingly, recognition of the soft shunt is very important to the safe and efficient operation of the battery 11.

Soft shunt recognition is provided by means of measuring the voltage of the cell under open circuit voltage conditions ($V_{OCV}$). Open circuit voltage conditions exist during a charge interruption period or currentness phase period. A soft shunt is recognized by a drop in the $V_{OCV}$ of the cell, provided the $V_{OCV}$ is measured after an equilibration time period upon interrupting the charging current in order to obtain "steady" open circuit voltage, $E_{OCV}$. As will be discussed more fully below, $E_{OCV}$ is obtained by sampling the open circuit voltage at a point or points after current interruption wherein the open circuit voltage is substantially free of the ohmic and chemical components of open circuit voltage.

The time intervals between currentless phase measuring periods should be short enough so that a decrease in the $E_{OCV}$ is not compensated through natural increasing of the open circuit voltage value during the charging process. However, the time interval should be long enough to allow the leakage current to effect the open circuit voltage value. The preferred time interval to monitor for a soft shunt is between approximately 1–10,000 milliseconds, more preferably approximately 5–7,500 milliseconds, even more preferably approximately 10–5,000 milliseconds, and most preferably between 100 and 1,000 milliseconds. These values are based on experimental data.

As soon as a drop or negative slope $-\Delta V_{OCV}$ in the open circuit voltage is identified within the time interval discussed above, it should be recognized as an indicator of the beginning of a soft shunt. Measuring the open circuit voltage can provide much more precise information regarding the appearance of a shunt and is much more sensitive than measuring the voltage during charging because the effect of the charging current and the electrical noises of the battery under the charging process are not present in open circuit voltage conditions. A micro-processor can be used to recognize the voltage drop and should be designed to recognize at least a 4–6 mV open circuit voltage change. As a result, the minimum leakage current for the NP-500 lithium battery can be specified as:

$$I_2 = \Delta V_{OCV}/R_C = 4 \text{ mV}/0.15\Omega = 27 \text{ mA} \tag{9}$$

$$I_2 = \Delta V_{OCV}/R_C = 6 \text{ mV}/0.15\Omega = 40 \text{ mA} \tag{10}$$

Again $R_C$ is the internal resistance of the NP-500 lithium cell (15 Ω) and the capacity is 1200 mA. Thus if the battery loses capacity at a rate of no greater than 2.25%/hour (27 mA/1200 mA) to about 3.33% (40 mA/1200 mA) this should be considered normal leakage. However, if the leakage is greater than this range then charging should be terminated (this indicates overcharge in individual cells).

Figure 3:
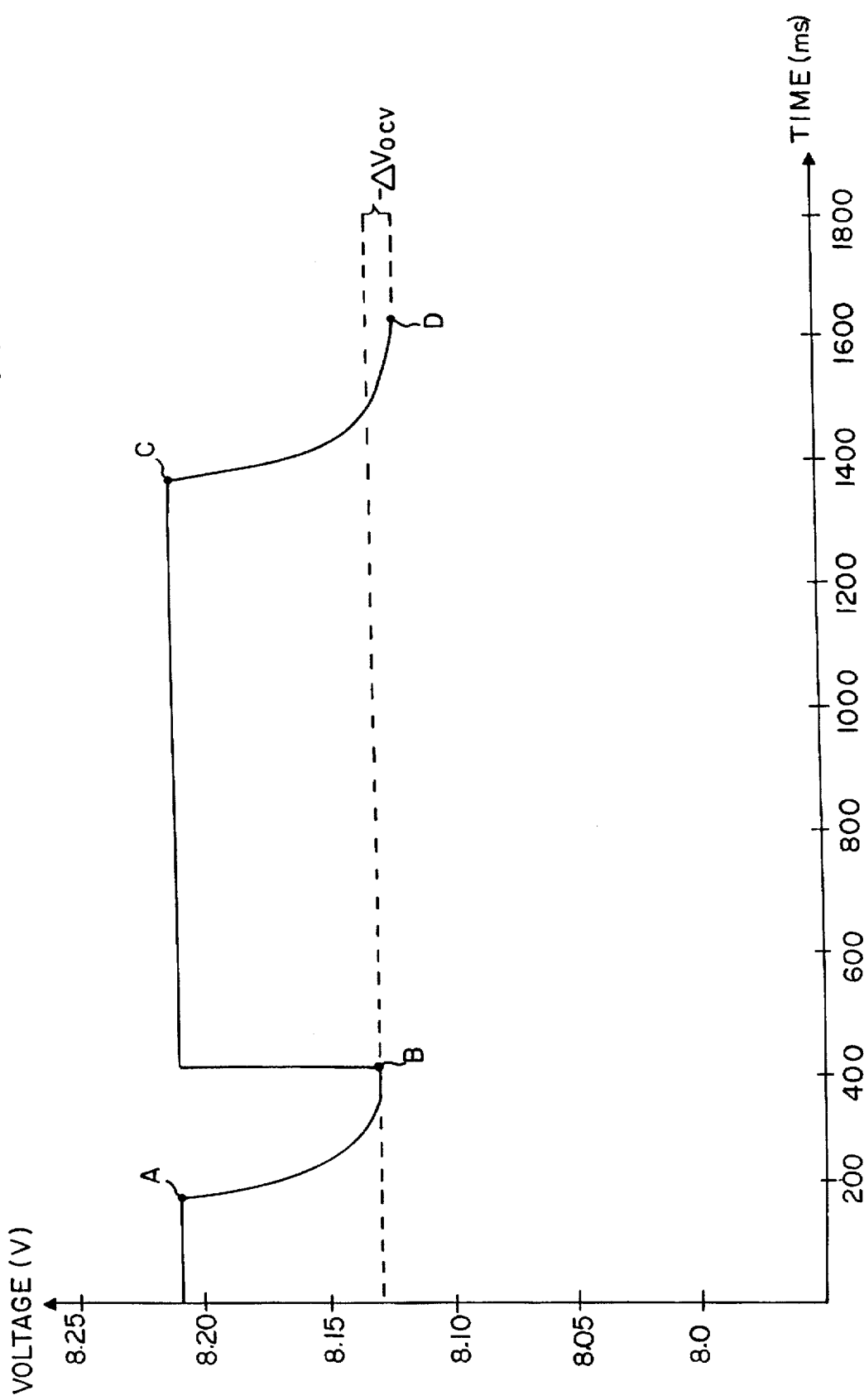
FIG. 3 is a graph illustrating the appearance of soft shunt which is identified within two consecutive open circuit periods.

FIG. 3 illustrates a typical charging scheme useful to recognize the occurrence of a soft shunt. The charging current is interrupted at point A in order for the open circuit voltage $V_{OCV}$ of the NP-500 battery to be sampled. A rest period of approximately 200 milliseconds is allowed to pass so to allow the battery time to equilibrate. Prior to continuing charge at point B, the $V_{OCV}$ is sampled and stored in microcontroller 22, charging is continued for approximately one second, and the charging current is interrupted at point C. Again, the battery 11 is allowed to equilibrate and the open circuit voltage is again sampled at point D. As long as the time period in which the battery 11 is allowed to equilibrate is sufficiently long (i.e. greater than 200 ms), the sampled open circuit voltage can be considered a "steady" open circuit voltage, $E_{OCV}$. The difference between the later sampled open circuit voltage and the earlier sampled open circuit voltage, both of which were sampled at nearly identical time points after charge interruption, is analyzed to identify the beginning of a soft shunt. If a negative change in sampled $V_{OCV}$ (actually $E_{OCV}$) is recognized, it is determined whether it is sufficient to indicate onset of soft shunting or whether it is attributable to leakage within normal charging parameters. From the data above a $-\Delta E_{OCV}$ greater than 4–6 mV is sufficient to indicate onset of a soft shunt. At this point, charging should be terminated, and the battery should be disposed of for safety purposes.

Another indicator of a shunt occurrence is the recognition of the occurrence of a chemical shunt. A chemical shunt is caused by the interaction of metallic lithium and the electrolyte. FIG. 5 illustrates the importance of understanding the voltage components that are present in battery 11 when the current is interrupted to measure the open circuit voltage $V_{OCV}$ of the battery. Both chemical and electrical phenomena must be taken into consideration. Realizing the importance of these components permits more sensitive recognition of potentially dangerous shunts. The expression for battery charging voltage can be written as follows.

$$V = E_{OCV} + I(R_{CP} + R_\Omega) \tag{11}$$

where V is the battery voltage, $E_{OCV}$ is the unsteady open circuit voltage, $R_{CP}$ is the chemical resistance due to chemical polarization and $R_{106}$ is the ohmic resistance due to the ohmic components of the battery. The chemical resistance includes the electrochemical and diffusion increments of polarization of the electrode and the electrolyte. The unsteady open circuit voltage $E_{OCV}$ includes the polarization in solid phase of the transition metal oxide electrode. Equation (1) can be rewritten in terms of overvoltage as:

$$V = E_{OCV} + V_{CP} + V_\Omega \tag{12}$$

where $V_{CP}$ is the voltage due to chemical components of the cell and $V_\Omega$ is the voltage due to the ohmic component of the cell. As stated above, $V_\Omega$ is associated with the ohm component of cell resistance and disappears almost immediately after current interruption. Thus the time interval necessary to measure $V_\Omega$ is between 1–5 milliseconds. The limitation of one millisecond being a result of measurement devices or techniques which are unable to accurately sample in the time period lower than 1 millisecond. The ohm resistance of the lithium cell is associated with the electrolyte resistance since organic liquid electrolyte or solid polymer electrolyte, or the combination thereof, has a higher specific resistance than water electrolyte. Typical electrolytes include a organic electrolytes solvent such as propylene and ethylene carbonate. These organic liquid electrolytes generally have conductivities that are about two orders magnitude lower than aqueous electrolytes. Alternatively, solid polymer electrolytes formed by into thin films can be used. These can be used both as the electrolyte and the separator. These electrolytes have lower ionic conductivity and low lithium transport numbers compared to the liquid electrolytes, but they are less reactive with lithium which may enhance the safety of the battery. From FIG. 5, $V_\Omega$ is the difference between $V_{OCV-1}$ and $V_1$. $V_{OCV-1}$ includes the chemical component $V_{CP}$ and the "steady" open circuit voltage $E_{OCV}$ of the battery and to some extent the ohmic component $V_\Omega$. However, the ohmic component, $V_\Omega$, dissipates so rapidly, that in the range of 1 to 5 milliseconds after current interruption $V_{OCV-1}$ consists primarily of chemical polarization, $V_{CP}$, and steady open circuit voltage $E_{OCV}$. Accordingly it is preferable to sample the chemical component of the voltage, $V_{CP}$, within the range of 1–500 milliseconds, more preferably in the range of 1–100 ms, even more preferably in the range of 1–10 ms and most preferably within the range of 1–5 milliseconds after current interruption. After 500 milliseconds, the open circuit voltage can be considered substantially free of both the ohmic and chemical components of the battery 11.

As seen in FIG. 5, a typical charging scheme which is employed to recognize a chemical shunt follows. The charging current is interrupted and a $V_{OCV}$ value is sampled within 1–5 milliseconds after charge interruption. A predetermined time period is allowed to elapse, usually within the range of 10–10,000 milliseconds, preferably around 500 milliseconds after charge interruption, and the steady open circuit $E_{OCV}$ is sampled. After the two $V_{OCV}$ points ($V_{OCV-1}$ and $E_{OCV-1}$) are sampled, charging is continued. Within a predetermined time period, i.e. one second, charging is interrupted and $V_{OCV}$ at 1–5 milliseconds ($V_{OCV-2}$) and 500 milliseconds ($E_{OCV-2}$) is measured again. As stated above, the ohmic component of the battery voltage $V_\Omega$ can only be sampled within the first 1–5 milliseconds after current interruption. From Eq. 12, $$V_\Omega = V - (E_{OCV} + V_{CP}) \quad (13)$$

Knowing $V_\Omega$ and the charging voltage V, one can obtain the sum of the open circuit voltage and the chemical polarization value the battery 11 by:

$$(E_{OCV} + V_{CP}) = V - V_\Omega \quad (14)$$

Since we also measure the $V_{OCV}$ at a time period where the chemical component has dissipated, we can obtain the chemical component of the first sampled time period by:

$$V_{CP-1} = V_1 - V_{\Omega-1} - E_{OCV-1} \quad (15)$$

where $V_1$ is the first sampled charging voltage, $V_{\Omega-1}$ is the first sampled ohmic component, $E_{OCV-1}$ is the first sampled steady open circuit voltage. Although, as seen in FIG. 5 the open circuit voltage at 275 milliseconds is not truly steady, as long as the later sampled steady open circuit voltage $E_{OCV-2}$ is measured at the same time interval after interrupting the charging current there should not be a substantial impact on the recognition of a shunt because the sampled values for $E_{OCV}$ will be normalized. The same sequence of events is repeated for the next measurement period wherein $V_2$ is the later sampled charging voltage, $V_{\Omega-2}$ is the later sampled ohmic component, and $E_{OCV-2}$ is the later sampled steady open circuit voltage. A negative drop in the chemical components $-\Delta V_{CP}$ which is greater than a predetermined $\Delta V°_{CP}$ indicates the occurrence of chemical shunting. Eq. 16 summarizes the identification of a chemical shunt.

$$\Delta V_{CP} = V_{CP} - V_{CP} = (V_2 - V_{\Omega-2} - E_{OCV-2}) - (V_1 - V_{\Omega-1} - E_{OCV-1}) \quad (16)$$

In this scheme if $\Delta V_{CP}$ is negative and exceed $\Delta V°_{CP}$, charging is terminated. In fact, it is not necessary to monitor the voltages $V_1$, $V_2$ or to determine $V_{\Omega-1}$, $V_{\Omega-2}$ to identify a soft shunt. All that is necessary is to sample $V_{OCV-1}$, $V_{OCV-2}$, $E_{OCV-1}$, and $E_{OCV-2}$. In this case:

$$\Delta V_{CP} = V_{CP} - V_{CP} = (V_{OCV-2} - E_{OCV-2}) - (V_{OCV-1} - E_{OCV-1}) \quad (17)$$

From Eq. 17 it is realized that it is important to factor in $E_{OCV}$ when deriving $V_{CP}$. This is due to the fact that under normal charging conditions $E_{OCV}$ increases and as discussed above when a soft shunt occurs there is a drop in $E_{OCV}$. Accordingly, subtracting $E_{OCV-1}$ from $V_{OCV-1}$ normalizes $V_{CP}$ as opposed to simply using the difference between $V_{OCV-2}$ and $V_{OCV-1}$ as the chemical polarization gradient.

Figure 4:
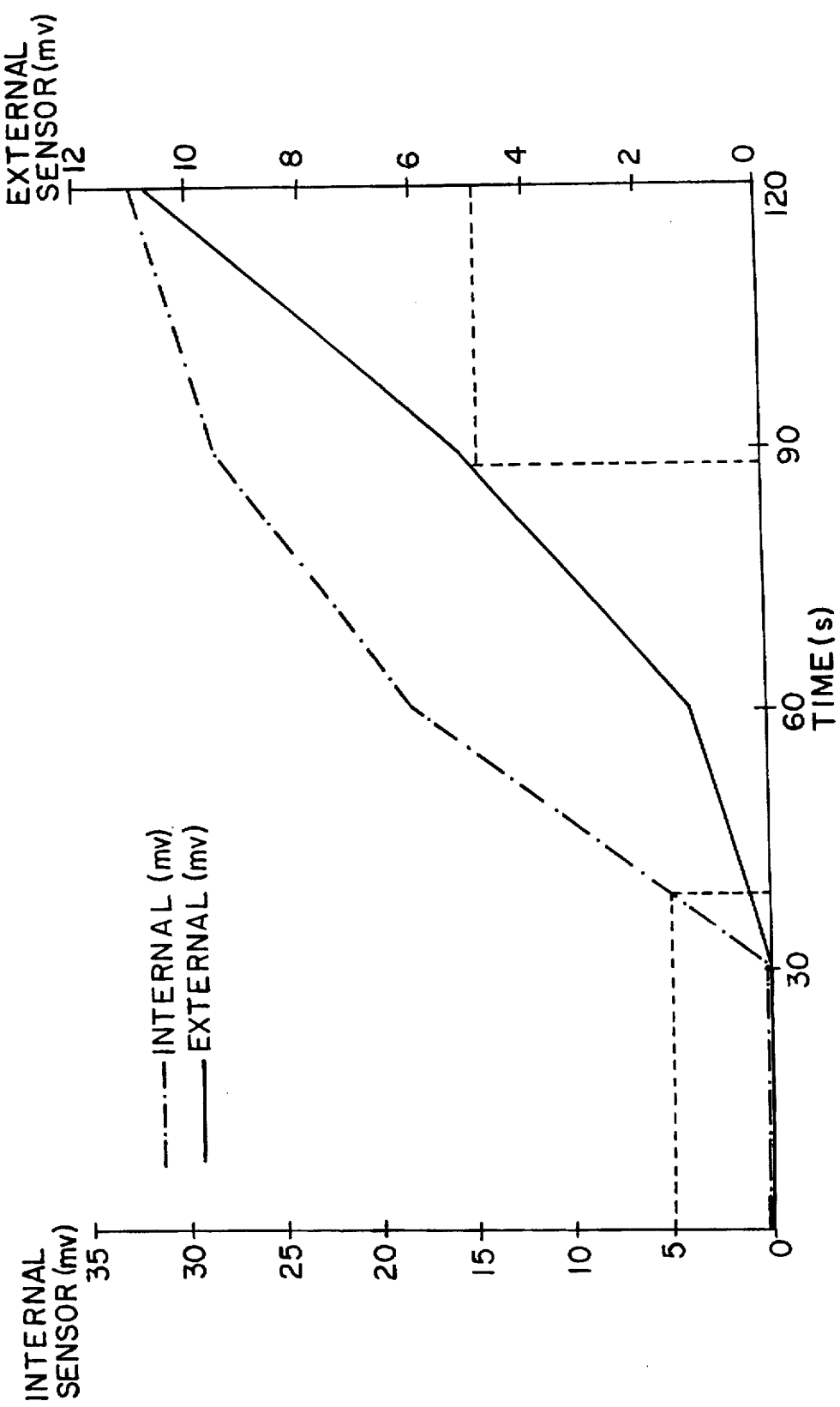
FIG. 4 is a graph illustrating temperature response during recharging of a rechargeable lithium battery identified by an external thermocouple and derived using chemical polarization.

The physical manifestation of a chemical shunt is a rise in temperature of the battery 11 and a drop in chemical polarization value. The benefits obtained by measuring the chemical polarization of the battery 11 as opposed to measuring the temperature of the battery 11 are illustrated in FIG. 4. Although a thermistor or temperature sensor 19 can be used to monitor the external temperature of the battery 11, measuring the $V_{CP}$ of the battery 11 allows for much more precise identification of a chemical shunt. The chemical polarization voltage $V_{CP}$ in essence functions as an internal sensor of the temperature. In FIG. 4, the external temperature of a NP-500 lithium battery monitored by an external thermistor is plotted along with the $V_{CP}$ obtained according to Eq. 14 above. As is clearly seen the $\Delta V_{CP}$ from 60 seconds on out is much greater than the $\Delta V_{Temp}$ information provided by the external thermistor. Accordingly, the internal measurement of the temperature increase via $V_{CP}$ is a much more accurate indicator of the onset of shunting. The more precise information provided by the measurement of the chemical polarization is very important due to the fact that in avoiding combustion or violent explosion of battery 11 every second is crucial in determining when charging should be terminated.

Although each of the respective shunt identification techniques have been described independently of each other, the most preferred embodiment of the present invention is a battery charger 20 which combines the methodologies described above is most preferred. Following is a brief description of the preferred methodology which has been developed to safely and efficiently charge a rechargeable lithium based battery, in this case a NP-500 rechargeable lithium battery. Battery 11 is charged with battery charger 20. Every 10 milliseconds the voltage of the battery is sampled by voltage sensor 21. If within this ten millisecond interval a voltage drop calculated by Eq. 8 is not identified charging is continued. After an initial equilibration period, i.e. 3–5 minutes after charging has begun, the open circuit voltage $V_{OCV}$ of the battery is sampled. During the first current interruption period the first open circuit voltage value $V_{OCV-1}$ is sampled within 1–5 ms after current interruption and the "steady" open circuit voltage $E_{OCV-1}$ is sampled at approximately 500 ms. Charging is then continued, and every minute thereafter the charging current is interrupted to sample the charging voltage $V_1$, $V_n$, $V_{n+1}$, the open circuit voltage within 1–5 ms $V_{OCV-2}$, $V_{OCV-n}$, $V_{OCV-n+1}$, and the "steady" open circuit voltage $E_{OCV-2}$, $E_{OCV-n}$, $E_{OCV-n+1}$ where n is any whole integer. This information is then recorded, stored, compiled, and analyzed in microcontroller 22 or data compiler 16. If a negative change in the charging voltage $-\Delta V$ which is equal to $V_{n+1}-V_n$ exceeds a predetermined negative change $-\Delta V°$ (i.e. 80 mV from Eq. 8) charging is terminated due to the occurrence of a hard shunt. If a negative change in the steady open circuit voltage $\Delta E_{OCV}$ which is equal to $E_{OCV-n+1}-E_{OCV-n}$ exceeds a predetermined negative change $-\Delta E°_{OCV}$ (i.e. 4–6 mV from Eq. 9) charging is terminated due to occurrence of soft shunt. Finally if a negative change in the chemical polarization voltage $-\Delta V_{CP}$ which is calculated according to Eq. 17 from the sampled open circuit voltage within 1–5 ms after charge current interruption $V_{OCV-n}$, $V_{OCV-n+1}$, and the "steady" open circuit voltage $E_{OCV-n}$, $E_{OCV-n+1}$ exceeds a predetermined $-\Delta V°_{ch}$ (i.e. 15 mV from FIG. 4) charging is terminated due to the occurrence of a chemical shunt.

Although the preferred methods have been described in detail, it should be understood that the various changes, substitutions and alterations can be made without departing from the spirit and scope of the invention as defined by the claims appended hereto.

What is claimed is:

1. A method of recognizing a shunt in a rechargeable lithium battery comprising:

charging the battery with a charging current;

sampling the voltage of the battery at pre-determined time intervals, wherein the step of sampling the voltage of the battery includes interrupting the charging current to sample an open circuit voltage, said open circuit voltage being sampled in a range of 5–5,000 ms after the charging current has been interrupted in order to obtain a steady open circuit voltage;

identifying one or more points indicating onset of shunting, wherein the point indicating onset of shunting is identified by a drop in the steady open circuit voltage of the battery;

continuing charging if the point is not identified; and terminating charging if the point indicating shunting is identified.

2. The method of claim 1, wherein the voltage sampled includes voltage sampled during charging of the battery.

3. The method of claim 2, wherein said point indicating onset of shunting identified by a drop in the voltage sampled during charging.

4. The method of claim 3, wherein the drop in the voltage sampled during charging exceeds 80 mV.

5. The method of claim 4, wherein said voltage sampled during charging is sampled at a plurality of time intervals, said time intervals being within 1 ms–5 seconds of each other.

6. The method of claim 1, wherein the drop in steady open circuit voltage is at least mV.

7. The method of claim 1, wherein the open circuit voltage is sampled in a range of 1–5 ms after the charging current has been interrupted in order to obtain a chemical polarization voltage, $V_{CP}$.

8. The method of claim 7, wherein the point indicating onset of shunting is identified by a drop in said chemical polarization voltage $V_{CP}$.

9. A method of dendrite recognition in a rechargeable lithium battery comprising:

sampling a charging voltage of the battery;

interrupting charging of the battery to sample an open circuit voltage of the battery;

identifying one or more points indicative of dendrite formation, said point indicative of dendrite formation being selected from the group consisting of:

a. a negative gradient in sampled voltage values, $\Delta V$;

a negative gradient in sampled steady open circuit values $-E_{OCV}$ a negative gradient in chemical polarization voltage values $-\Delta V_{CP}$, and d. a function of any two or all three of the above points;

continuing charging if the point indicative of dendrite formation is not identified; and terminating charging if the point indicative of dendrite formation is identified.

10. The method of claim 9, wherein said voltage during charging is sampled at a plurality of time intervals, said time intervals being within 1 ms–5 seconds of each other.

11. The method of claim 9, wherein the steady open circuit voltage $E_{OCV}$ is sampled within 5–5,000 ms after interrupting charging.

12. A battery charger capable of shunt recognition for charging a rechargeable battery comprising:

a power supply to provide charging current to said battery or cell;

a charge interrupter for periodically interrupting the charging current;

a voltage sensor for sampling voltage values of the battery, said voltage values being selected from the group consisting of a charging voltage value, V, a steady open circuit value $E_{OCV}$, and a chemical polarization voltage value $V_{CP}$;

a data compiler for compiling and analyzing the voltage values to identify a voltage point indicating onset of a shunting; and a charging current adjuster for adjusting the charging current when said voltage points are identified.

13. The battery charger of claim 12, wherein the voltage sensor samples the charging voltage V at a plurality of points to derive a voltage gradient $\Delta V$, said charging current being terminated if the derived voltage gradient $\Delta V$ is greater than a predetermined voltage gradient $\Delta V°$ ($\Delta V > \Delta V°$).

14. The battery charger of claim 12, wherein the voltage sensor samples the steady open circuit voltage $E_{OCV}$ at a plurality of points to derive an open circuit voltage gradient $\Delta E_{OCV}$, said charging current being terminated if the derived open circuit voltage gradient $\Delta E_{OCV}$ is greater than a predetermined open circuit voltage gradient $\Delta E_{OCV}°$ ($\Delta E_{OCV} > \Delta E_{OCV}°$).

15. The battery charger of claim 12, wherein the voltage sensor samples the chemical polarization voltage $V_{CP}$ at a plurality of points to derive a chemical polarization gradient $\Delta V_{CP}$, said charging current being terminated if the derived chemical polarization gradient $\Delta V_{CP}$ is greater than a predetermined chemical polarization voltage gradient $\Delta V_{CP}°$ ($\Delta V_{CP} > \Delta V_{CP}°$).

16. The method of claim 8, wherein said drop in said chemical polarization voltage $V_{CP}$ is monitored over more than one charge interruption period.

* * * * *